(12) United States Patent
Meade et al.

(10) Patent No.: US 9,406,878 B2
(45) Date of Patent: *Aug. 2, 2016

(54) RESISTIVE MEMORY CELLS WITH TWO DISCRETE LAYERS OF PROGRAMMABLE MATERIAL, METHODS OF PROGRAMMING MEMORY CELLS, AND METHODS OF FORMING MEMORY CELLS

(71) Applicant: Micron Technology, Inc., Boise, ID (US)

(72) Inventors: Roy E. Meade, Boise, ID (US); Bhaskar Srinivasan, Allen, TX (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

This patent is subject to a terminal disclaimer.

(21) Appl. No.: 14/444,795

(22) Filed: Jul. 28, 2014

(65) Prior Publication Data
US 2014/0332751 A1     Nov. 13, 2014

Related U.S. Application Data

(60) Continuation of application No. 13/956,242, filed on Jul. 31, 2013, now Pat. No. 8,811,063, which is a division of application No. 12/917,361, filed on Nov. 1, 2010, now Pat. No. 8,526,213.

(51) Int. Cl.
    *G11C 13/00*          (2006.01)
    *H01L 45/00*          (2006.01)

(52) U.S. Cl.
    CPC .......... *H01L 45/085* (2013.01); *G11C 13/0007* (2013.01); *G11C 13/0011* (2013.01);
    (Continued)

(58) Field of Classification Search
    CPC ... H01L 45/085; H01L 45/1266; H01L 45/04; H01L 45/1233; H01L 45/145; H01L 45/143; H01L 45/142; H01L 45/144; H01L 45/146; G11C 13/0007; G11C 13/0069; G11C 13/0011; G11C 2213/56
See application file for complete search history.

(56) References Cited

U.S. PATENT DOCUMENTS

| | | |
|---|---|---|
| 4,715,685 A | 12/1987 | Yaniv et al. |
| 4,964,080 A | 10/1990 | Tzeng |

(Continued)

FOREIGN PATENT DOCUMENTS

| | | |
|---|---|---|
| CN | 1444284 | 9/2003 |
| CN | 1459792 | 12/2003 |

(Continued)

OTHER PUBLICATIONS

WO PCT/US2008/084422 Search Rept., Mar. 19, 2009, Micron Technology, Inc.

(Continued)

*Primary Examiner* — J. H. Hur
(74) *Attorney, Agent, or Firm* — Wells St. John P.S.

(57) ABSTRACT

Some embodiments include methods of programming a memory cell. A plurality of charge carriers may be moved within the memory cell, with an average charge across the moving charge carriers having an absolute value greater than 2. Some embodiments include methods of forming and programming an ionic-transport-based memory cell. A stack is formed to have programmable material between first and second electrodes. The programmable material has mobile ions which are moved within the programmable material to transform the programmable material from one memory state to another. An average charge across the moving mobile ions has an absolute value greater than 2. Some embodiments include memory cells with programmable material between first and second electrodes. The programmable material includes an aluminum nitride first layer, and includes a second layer containing a mobile ion species in common with the first layer.

6 Claims, 3 Drawing Sheets

(52) U.S. Cl.
CPC ............ *G11C13/0069* (2013.01); *H01L 45/04* (2013.01); *H01L 45/1233* (2013.01); *H01L 45/1266* (2013.01); *H01L 45/142* (2013.01); *H01L 45/143* (2013.01); *H01L 45/144* (2013.01); *H01L 45/145* (2013.01); *G11C 2213/56* (2013.01); *H01L 45/146* (2013.01)

(56) References Cited

U.S. PATENT DOCUMENTS

| | | |
|---|---|---|
| 5,049,970 A | 9/1991 | Tanaka et al. |
| 5,122,476 A | 6/1992 | Fazan et al. |
| 6,034,882 A | 3/2000 | Johnson et al. |
| 6,218,696 B1 | 4/2001 | Radius |
| 6,432,767 B2 | 8/2002 | Torii et al. |
| 6,524,867 B2 | 2/2003 | Yang et al. |
| 6,552,952 B2 | 4/2003 | Pascucci |
| 6,687,147 B2 | 2/2004 | Fricke et al. |
| 6,693,821 B2 | 2/2004 | Hsu et al. |
| 6,693,846 B2 | 2/2004 | Fibranz |
| 6,717,881 B2 | 4/2004 | Ooishi |
| 6,753,561 B1 | 6/2004 | Rinerson et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |
| 6,806,531 B1 | 10/2004 | Chen et al. |
| 6,834,008 B2 | 12/2004 | Rinerson et al. |
| 6,873,544 B2 | 3/2005 | Perner et al. |
| 6,905,937 B2 | 6/2005 | Hsu et al. |
| 6,930,324 B2 | 8/2005 | Kowalski et al. |
| 6,940,113 B2 | 9/2005 | Hsu et al. |
| 6,946,702 B2 | 9/2005 | Jang |
| 6,950,369 B2 | 9/2005 | Kunikiyo et al. |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 6,985,374 B2 | 1/2006 | Yamamura |
| 7,002,197 B2 | 2/2006 | Perner et al. |
| 7,005,350 B2 | 2/2006 | Walker et al. |
| 7,009,278 B2 | 3/2006 | Hsu |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Tripsas et al. |
| 7,046,550 B1 | 5/2006 | Reohr et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,109,544 B2 | 9/2006 | Schoelesser et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,465,675 B2 | 12/2008 | Koh |
| 7,473,982 B2 | 1/2009 | Aono et al. |
| 7,489,552 B2 | 2/2009 | Kurotsuchi et al. |
| 7,525,410 B2 | 4/2009 | Aono et al. |
| 7,538,338 B2 | 5/2009 | Rinerson et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,666,526 B2 | 2/2010 | Chen et al. |
| 7,671,417 B2 | 3/2010 | Yoshida et al. |
| 7,679,812 B2 | 3/2010 | Sasagawa et al. |
| 7,687,793 B2 | 3/2010 | Harshfield et al. |
| 7,687,840 B2 | 3/2010 | Shinmura |
| 7,696,077 B2 | 4/2010 | Liu |
| 7,700,935 B2 | 4/2010 | Kim et al. |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 7,799,672 B2 | 9/2010 | Hashimoto et al. |
| 7,838,861 B2 | 11/2010 | Klostermann |
| 7,842,991 B2 | 11/2010 | Cho et al. |
| 7,864,568 B2 | 1/2011 | Fujisaki et al. |
| 7,898,839 B2 | 3/2011 | Aoki |
| 7,907,436 B2 | 3/2011 | Maejima et al. |
| 7,910,909 B2 | 3/2011 | Kim et al. |
| 7,948,784 B2 | 5/2011 | Kajigaya |
| 7,952,914 B2 | 5/2011 | Baek et al. |
| 7,990,754 B2 | 8/2011 | Azuma et al. |
| 8,021,897 B2 | 9/2011 | Sills et al. |
| 8,043,926 B2 | 10/2011 | Cho et al. |
| 8,048,755 B2 | 11/2011 | Sandhu et al. |
| 8,094,477 B2 | 1/2012 | Maejima |
| 8,098,520 B2 | 1/2012 | Seigler et al. |
| 8,106,375 B2 | 1/2012 | Chen et al. |
| 8,114,468 B2 | 2/2012 | Sandhu et al. |
| 8,124,968 B2 | 2/2012 | Koo et al. |
| 8,154,908 B2 | 4/2012 | Maejima et al. |
| 8,154,909 B2 | 4/2012 | Azuma et al. |
| 8,295,077 B2 | 10/2012 | Murooka |
| 8,355,274 B2 | 1/2013 | Arita et al. |
| 8,411,477 B2 | 4/2013 | Tang et al. |
| 8,431,458 B2 | 4/2013 | Sills et al. |
| 8,436,414 B2 | 5/2013 | Tanaka et al. |
| 8,526,213 B2 * | 9/2013 | Meade ............... G11C 13/0007 257/2 |
| 8,536,556 B2 | 9/2013 | Fukumizu |
| 8,537,592 B2 | 9/2013 | Liu |
| 8,542,513 B2 | 9/2013 | Tang et al. |
| 8,611,121 B2 | 12/2013 | Ahn et al. |
| 8,652,909 B2 | 2/2014 | Sills et al. |
| 8,791,447 B2 | 7/2014 | Liu et al. |
| 8,811,063 B2 * | 8/2014 | Meade ............... G11C 13/0007 257/2 |
| 8,854,863 B2 | 10/2014 | Liu |
| 2002/0018355 A1 | 2/2002 | Johnson et al. |
| 2002/0034117 A1 | 3/2002 | Okazawa |
| 2002/0079524 A1 | 6/2002 | Dennison |
| 2002/0196695 A1 | 12/2002 | Pascucci |
| 2003/0031047 A1 | 2/2003 | Anthony et al. |
| 2003/0086313 A1 | 5/2003 | Asao |
| 2003/0174042 A1 | 9/2003 | Aono et al. |
| 2003/0174570 A1 | 9/2003 | Oishi |
| 2003/0185049 A1 | 10/2003 | Fricke et al. |
| 2003/0218902 A1 | 11/2003 | Perner et al. |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0188714 A1 | 9/2004 | Scheuerlein |
| 2004/0245547 A1 | 12/2004 | Stipe |
| 2005/0001257 A1 | 1/2005 | Schoelesser et al. |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0205943 A1 | 9/2005 | Yamada |
| 2005/0243844 A1 | 11/2005 | Aono et al. |
| 2005/0250281 A1 | 11/2005 | Ufert et al. |

(56) References Cited

U.S. PATENT DOCUMENTS

| | | |
|---|---|---|
| 2005/0269646 A1 | 12/2005 | Yamada |
| 2005/0275003 A1 | 12/2005 | Shinmura |
| 2005/0275042 A1 | 12/2005 | Hwang |
| 2005/0287741 A1 | 12/2005 | Ding |
| 2006/0023498 A1 | 2/2006 | Asao |
| 2006/0035451 A1 | 2/2006 | Hsu |
| 2006/0046509 A1 | 3/2006 | Gwan-Hyeob |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0215445 A1 | 9/2006 | Baek et al. |
| 2006/0258079 A1 | 11/2006 | Lung et al. |
| 2006/0258089 A1 | 11/2006 | Chung-Zen |
| 2006/0274593 A1 | 12/2006 | Kurotsuchi et al. |
| 2006/0284242 A1 | 12/2006 | Jo |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0019923 A1 | 1/2007 | Sasagawa et al. |
| 2007/0034848 A1 | 2/2007 | Liu |
| 2007/0041235 A1 | 2/2007 | Inoue |
| 2007/0045615 A1 | 3/2007 | Cho et al. |
| 2007/0048990 A1 | 3/2007 | Zhuang et al. |
| 2007/0086235 A1 | 4/2007 | Kim et al. |
| 2007/0109835 A1 | 5/2007 | Hsu |
| 2007/0120124 A1 | 5/2007 | Chen et al. |
| 2007/0121369 A1 | 5/2007 | Happ |
| 2007/0123039 A1 | 5/2007 | Elkins et al. |
| 2007/0132049 A1 | 6/2007 | Stipe et al. |
| 2007/0165434 A1 | 7/2007 | Lee et al. |
| 2007/0167008 A1 | 7/2007 | Hsu et al. |
| 2007/0171706 A1 | 7/2007 | Fuji |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1 | 12/2007 | Toda et al. |
| 2007/0295950 A1 | 12/2007 | Cho et al. |
| 2008/0001172 A1 | 1/2008 | Karg et al. |
| 2008/0008642 A1 | 1/2008 | Mori et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0036508 A1 | 2/2008 | Sakamoto et al. |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0089105 A1 | 4/2008 | Ro et al. |
| 2008/0093591 A1 | 4/2008 | Khang et al. |
| 2008/0099753 A1 | 5/2008 | Song et al. |
| 2008/0102278 A1 | 5/2008 | Kreupl et al. |
| 2008/0105862 A1 | 5/2008 | Lung et al. |
| 2008/0106925 A1 | 5/2008 | Paz de Araujo et al. |
| 2008/0123390 A1 | 5/2008 | Kim et al. |
| 2008/0157257 A1 | 7/2008 | Bertin et al. |
| 2008/0175031 A1 | 7/2008 | Park et al. |
| 2008/0175032 A1 | 7/2008 | Tanaka et al. |
| 2008/0185571 A1 | 8/2008 | Happ et al. |
| 2008/0185687 A1* | 8/2008 | Hong ............... H01L 45/04 257/536 |
| 2008/0212361 A1 | 9/2008 | Bertin et al. |
| 2008/0232160 A1 | 9/2008 | Gopalakrishnan |
| 2008/0247219 A1 | 10/2008 | Choi et al. |
| 2008/0251779 A1 | 10/2008 | Kakosehke et al. |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kijigaya et al. |
| 2009/0072217 A1 | 3/2009 | Klosterman |
| 2009/0085121 A1 | 4/2009 | Park et al. |
| 2009/0097295 A1* | 4/2009 | Morimoto .......... G11C 13/0004 365/51 |
| 2009/0141547 A1 | 6/2009 | Jin et al. |
| 2009/0168495 A1 | 7/2009 | Aoki |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0207681 A1 | 8/2009 | Juengling |
| 2009/0218557 A1 | 9/2009 | Sato |
| 2009/0250681 A1 | 10/2009 | Smythe et al. |
| 2009/0261314 A1 | 10/2009 | Kim et al. |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0316474 A1 | 12/2009 | Cho et al. |
| 2009/0317540 A1 | 12/2009 | Sandhu et al. |
| 2009/0321878 A1 | 12/2009 | Koo et al. |
| 2009/0323385 A1 | 12/2009 | Scheuerlein et al. |
| 2010/0003782 A1 | 1/2010 | Sinha et al. |
| 2010/0008163 A1 | 1/2010 | Liu |
| 2010/0044666 A1 | 2/2010 | Baek et al. |
| 2010/0046273 A1 | 2/2010 | Azuma et al. |
| 2010/0061132 A1 | 3/2010 | Fujisaki et al. |
| 2010/0065836 A1 | 3/2010 | Lee et al. |
| 2010/0084741 A1 | 4/2010 | Andres et al. |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157657 A1 | 6/2010 | Rinerson et al. |
| 2010/0157658 A1 | 6/2010 | Schloss et al. |
| 2010/0163820 A1 | 7/2010 | Son |
| 2010/0163829 A1 | 7/2010 | Wang et al. |
| 2010/0172171 A1 | 7/2010 | Azuma et al. |
| 2010/0176368 A1 | 7/2010 | Ko et al. |
| 2010/0178729 A1 | 7/2010 | Yoon et al. |
| 2010/0193758 A1 | 8/2010 | Tian et al. |
| 2010/0193761 A1 | 8/2010 | Amin et al. |
| 2010/0193762 A1 | 8/2010 | Hsieh et al. |
| 2010/0195371 A1 | 8/2010 | Ohba et al. |
| 2010/0232200 A1 | 9/2010 | Shepard |
| 2010/0237442 A1 | 9/2010 | Li et al. |
| 2010/0243980 A1 | 9/2010 | Fukumizu |
| 2010/0243983 A1 | 9/2010 | Chiang et al. |
| 2010/0258782 A1 | 10/2010 | Kuse et al. |
| 2010/0259960 A1 | 10/2010 | Samachisa |
| 2010/0259961 A1 | 10/2010 | Fasoli et al. |
| 2010/0259962 A1 | 10/2010 | Yan et al. |

(56) References Cited

U.S. PATENT DOCUMENTS

| | | | |
|---|---|---|---|
| 2011/0059576 A1 | 3/2011 | Cho et al. |
| 2011/0128775 A1 | 6/2011 | Maejima et al. |
| 2011/0171836 A1 | 7/2011 | Xia |
| 2011/0193044 A1 | 8/2011 | Sandhu et al. |
| 2011/0205783 A1 | 8/2011 | Murooka |
| 2011/0249486 A1 | 10/2011 | Azuma et al. |
| 2011/0261606 A1 | 10/2011 | Sandhu et al. |
| 2011/0261607 A1 | 10/2011 | Tang et al. |
| 2011/0309322 A1 | 12/2011 | Hwang |
| 2012/0119180 A1 | 5/2012 | Koo et al. |
| 2012/0140542 A1 | 6/2012 | Liu |
| 2012/0147648 A1 | 6/2012 | Scheuerlein |
| 2012/0164798 A1 | 6/2012 | Sills et al. |
| 2012/0187363 A1 | 7/2012 | Liu et al. |
| 2012/0248399 A1 | 10/2012 | Sasago et al. |
| 2013/0021836 A1 | 1/2013 | Liu |
| 2014/0247640 A1 | 9/2014 | Liu |

FOREIGN PATENT DOCUMENTS

| | | |
|---|---|---|
| CN | 1624803 | 6/2005 |
| CN | 101005113 | 12/2006 |
| CN | 101051670 | 4/2007 |
| CN | 101034732 | 9/2007 |
| CN | 101256831 | 9/2008 |
| CN | 101350360 | 1/2009 |
| CN | 101546602 | 9/2009 |
| CN | 101840995 | 9/2010 |
| CN | 2008-80124714.6 | 7/2012 |
| CN | 2011-80027954.6 | 5/2014 |
| CN | 2011800650428 | 5/2015 |
| EP | 1796103 | 6/2007 |
| EP | 11792836 | 12/2013 |
| EP | 118457274 | 11/2014 |
| EP | 11834802 | 3/2015 |
| EP | 14171745 | 3/2015 |
| GB | 1266513 | 3/1972 |
| JP | 2005-175457 | 6/2005 |
| JP | 2005-353779 | 6/2005 |
| JP | 2006-032729 | 2/2006 |
| JP | 2006-040981 | 2/2006 |
| JP | 2006-074028 | 3/2006 |
| JP | 2006-121044 | 5/2006 |
| JP | 2008-135744 | 6/2008 |
| JP | 2008-192995 | 8/2008 |
| JP | 2009-081251 | 4/2009 |
| JP | 2009-163867 | 7/2009 |
| JP | 2009-267411 | 11/2009 |
| JP | 2010-009669 | 1/2010 |
| JP | 2010-010688 | 1/2010 |
| JP | 2010-192569 | 9/2010 |
| JP | 2010-192646 | 9/2010 |
| JP | 2010-232214 | 10/2010 |
| JP | 2010-263211 | 11/2010 |
| KR | 2003-0048421 | 6/2003 |
| KR | 2005-0008353 | 1/2005 |
| KR | 2006-0087882 | 8/2006 |
| KR | 2010-0751736 | 8/2007 |
| KR | 2007-0111840 | 11/2007 |
| KR | 2007-0118865 | 12/2007 |
| KR | 2009-0109804 | 10/2009 |
| KR | 2010-0078808 | 7/2010 |
| KR | 2010-0083402 | 7/2010 |
| TW | 097147549 | 5/2013 |
| TW | 100119681 | 8/2013 |
| TW | 100135681 | 10/2013 |
| TW | 100142963 | 8/2014 |
| TW | 101102280 | 8/2014 |
| WO | WO 2006/003620 | 1/2006 |
| WO | WO 2008/029446 | 3/2008 |
| WO | WO 2009/127187 | 10/2009 |
| WO | WO 2010/068221 | 6/2010 |
| WO | PCT/US2008/084422 | 7/2010 |
| WO | WO 2010/082922 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | WO 2010/117911 | 10/2010 |
| WO | PCT/US2011/035601 | 12/2012 |
| WO | PCT/US2011/051785 | 4/2013 |
| WO | PCT/US2011/059095 | 6/2013 |
| WO | PCT/US2011/066770 | 7/2013 |

OTHER PUBLICATIONS

WO PCT/US2008/084422 Writ.Opin., Mar. 19, 2009, Micron Technology, Inc.
WO PCT/US2011/035601 Search Rept., Nov. 21, 2011, Micron Technology, Inc.
WO PCT/US2011/035601 Written Op., Nov. 21, 2011, Micron Technology, Inc.
WO PCT/US2011/051785 Search Rept., Apr. 10, 2012, Micron Technology, Inc.
WO PCT/US2011/051785 Writ. Opin., Apr. 10, 2012, Micron Technology, Inc.
WO PCT/US2011/059095 Search Rept., May 21, 2012, Micron Technology, Inc.
WO PCT/US2011/059095 Writ. Opin., May 21, 2012, Micron Technology, Inc.
WO PCT/US2011/066770 Search Rept., Sep. 11, 2012, Micron Technology, Inc.
WO PCT/US2011/066770 Writ. Opin., Sep. 11, 2012, Micron Technology, Inc.
WO PCT/US2012/021168 Search Rept., Jul. 24, 2012, Micron Technology, Inc.
WO PCT/US2012/021168 Written Op., Jul. 24, 2012, Micron Technology, Inc.
Baek et al., "Multi-Layer Cross-Point Binary Oxide Resistive Memory (OxRRAM) for Post-NAND Storage Application", IEEE, 2005, United States, 4 pages.
Bedeschi et al., "A Bipolar-Selected Phase Change Memory Featuring Multi-Level Cell Storage", IEEE Journal of Solid-State Circuits vol. 44, No. 1, Jan. 2009, United States, pp. 217-227.
Chen et al., "Non-Volatile Resistive Switching for Advanced Memory Applications", IEEE, 2005, United States, 4 pages.
Chen et al., "Perovskite RRAM Devices with Metal/Insulator/PCMO/Metal Heterostructures", IEEE, 2005, United States, pp. 125-128.
Choi et al., "Defect Structure and Electrical Properties of Single-Crystal Ba0.03SR0.97TiO3", Journal of the American Ceramic Society vol. 71, No. 4, 1988, United Kingdom, pp. 201-205.
Courtade et al., "Microstructure and Resistance Switching in NiO Binary Oxide Films Obtained from Ni Oxidation", IEEE, 2006, United States, pp. 94-99.
Dongsoo et al., "Resistance Switching of Al doped ZnO for Non Volatile Memory Applications" http://ieeexplore.ieee.org/iel5/10846/34184/01629506.pdf?tp=&arnumber=1629506&isnumber=34184.
Higaki et al., "Effects of Gas Phase Absorption into Si Substrates on Plasma Doping Process", IEEE 33rd Conference on European Solid-State Device Research, Sep. 16-18, 2003, Portugal, 4 pages.
Ho et al., "A Highly Reliable Self-Aligned Graded Oxide WOx Resistance Memory: Conduction Mechanisms and Reliability", IEEE 2007 Symposium on VLSI Technology Digest of Technical Papers, Kyoto, pp. 228-229.
Hosoi et al., "High Speed Unipolar Switching Resistance RAM (RRAM) Technology", IEEE International Electron Devices Meeting, Dec. 2006, United States, 4 pages.
Hudgens et al., "Overview of Phase-Change Chalcogenide Nonvolatile Memory Technology", MRS Bulletin, Nov. 2004, United States, pp. 829-832.
Ignatiev et al., "Resistance Non-volatile Memory-RRAM", Materials Research Society Symposium Proceedings vol. 997, 2007, United States, 9 pages.
Karg et al., "Nanoscale Resistive Memory Device using SrTiO3 Films", IEEE, 2007, United States, pp. 68-70.

(56) References Cited

OTHER PUBLICATIONS

Kau et al., "A Stackable Cross Point Phase Change Memory", IEEE, 2009, United States, pp. 27.1.1-27.1.4.
Komori et al., "Disturbless Flash Memory due to High Boost Efficiency on BiCS Structure and Optimal Memory Film Stack for Ultra High Density Storage Device", IEEE International Electron Devices Meeting, Dec. 15-17, 2008, United States, pp. 851-854.
Kooij et al., "Photoselective Metal Deposition on Amorphous Silicon p—i—n Solar Cells", Electrochemical Society Letters, Journal of the Electrochemical Society vol. 44, No. 10, Oct. 1997, United States, pp. L271-L272.
Kozicki et al., "Non-Volatile Memory Based on Solid Electrolytes", IEEE Non-Volatile Memory Technology Symposium, Nov. 15-17, 2004, United States, 8 pages.
Kozicki, "Memory Devices Based on Solid Electrolytes", Materials Research Society Symposium Proceedings vol. 997, 2007, United States, 10 pages.
Lee et al., "2-Stack 1D-1R Cross-Point Structure with Oxide Diodes as Switch Elements for High Density Resistance RAM Appilcations", IEEE, 2007, United States, pp. 771-774.
Lee et al., "Resistance Switching of Al Doped ZnO for Non Volatile Memory Applications", IEEE 21st Non-Volatile Semiconductor Memory Workshop, May 2006, United States, 2 pages.
Lin et al., "Effect of Top Electrode Material on Resistive Switching Properties of ZrO2 Film Memory Devices", IEEE Electron Device Letters vol. 28, No. 5, May 2007, United States, pp. 366-368.
Meyer et al., "Oxide Dual-Layer Memory Element for Scalable Non-Volatile Cross-Point Memory Technology", IEEE, 2008, United States, 5 pages.
Miyashita et al., "A Novel Bit-Line Process using Poly-Si Masked Dual-Damascene (PMDD) for 0.13 µm DRAMs and Beyond", IEEE, 2000, United States, pp. 15.4.1-15.4.4.
Muller et al., "Emerging Non-Volatile Memory Technologies", IEEE, 2003, United States, pp. 37-44.
Oh et al., "Full Integration of Highly Manufacturable 512Mb PRAM based on 90nm Technology", IEEE, 2006, United States, 4 pages.
Pein et al., "Performance of the 3-D PENCIL Flash EPROM Cell and Memory Array", IEEE Transaction on Electron Devices vol. 42, No. 11, Nov. 1995, United States, pp. 1982-1991.
Pellizzer et al., "A 90nm Phase Change Memory Technology for Stand-Alone Non-Volatile Memory Applications", IEEE Symposium on VLSI Technology 2006 Digest of Technical Papers, United States, 2 pages. Abstract Only.
Pirovano et al., "Self-Alignedµ Trench Phase-Change Memory Cell Architecture for 90nm Technology and Beyond", IEEE 37th European Solid State Device Research Conference, Sep. 11-13, 2007, Munich, 1 page. Abstract Only.
Scheck et al., "Selective Metal Electrodeposition Through Doping Modulation of Semiconductor Surfaces", Applied Physics Letters vol. 86, 2005, United States, 3 pages.
Wikipedia; "Programmable Metallization Cell", Dec. 11, 2007; Downloaded Dec. 13, 2011; http://en.wikipedia.org/wiki/Programmable_metallization_cell.
Wuttig, "Phase-Change Materials: Towards a Universal Memory?", Nature Materials vol. 4, Apr. 2005, United Kingdom, pp. 265-266.
Xing et al., "Characterization of AlGaN/GaN p—n Diodes with Selectively Regrown n—AlGaN by Metal-Organic Chemical-Vapor Deposition and its Application to GaN-Based Bipolar Transistors", Journal of Applied Physics vol. 97, 2005, United States, 4 pages.
Yih et al., "SiC/Si Heterojunction Diodes Fabricated by Self-Selective and by Blanket Rapid Thermal Chemical Vapor Deposition", IEEE Transactions on Electron Devices vol. 41, No. 3, Mar. 1994, United States, pp. 281-287.
Yoon et al., "Vertical Cross-Point Resistance Change Memory for Ultra-High Density Non-Volatile Memory Applications", IEEE Symposium on VLSI Technology Digest of Technical Papers, Jun. 16-18, 2009, United States, pp. 26-27.
Yu et al., "Structure Effects on Resistive Switching of Al/TiOx/Al Devices for RRAM Applications" IEEE Electron Device Letters vol. 29, No. 4, Apr. 2008, United States, pp. 331-333.
CN 101350360 Mach. Trans., Jan. 21, 2009, Shanghai Inst. of Microsystem.
CN 201180057866.0 SR Trans., Nov. 25, 2015, Micron Technology, Inc.

\* cited by examiner

RESISTIVE MEMORY CELLS WITH TWO DISCRETE LAYERS OF PROGRAMMABLE MATERIAL, METHODS OF PROGRAMMING MEMORY CELLS, AND METHODS OF FORMING MEMORY CELLS

RELATED PATENT DATA

This patent resulted from a continuation of U.S. patent application Ser. No. 13/956,242, which was filed Jul. 31, 2013, which issued as U.S. Pat. No. 8,811,063, and which is hereby incorporated herein by reference, which resulted from a divisional of U.S. patent application Ser. No. 12/917,361, which was filed Nov. 1, 2010, which issued as U.S. Pat. No. 8,526,213, and which is hereby incorporated herein by reference.

TECHNICAL FIELD

Memory cells, methods of programming memory cells, and methods of forming memory cells.

BACKGROUND

Memory is one type of integrated circuitry, and is used in computer systems for storing data. Integrated memory is usually fabricated in one or more arrays of individual memory cells. The memory cells might be volatile, semi-volatile, or nonvolatile. Nonvolatile memory cells can store data for extended periods of time, and in some instances can store data in the absence of power. Volatile memory dissipates and is therefore refreshed/rewritten to maintain data storage.

The memory cells are configured to retain or store memory in at least two different selectable states. In a binary system, the states are considered as either a "0" or a "1". In other systems, at least some individual memory cells may be configured to store more than two levels or states of information.

Integrated circuitry fabrication continues to strive to produce smaller and denser integrated circuits. The smallest and simplest memory cell will likely be comprised of two electrically conductive electrodes having a programmable material received between them.

Programmable materials may also be referred to as memory cell materials. Suitable programmable materials have two or more selectable resistive states to enable storing of information by an individual memory cell. The reading of the cell comprises determination of which of the states the programmable material is in, and the writing of information to the cell comprises placing the programmable material in a predetermined resistive state. Some programmable materials retain a resistive state in the absence of refresh, and thus may be incorporated into nonvolatile memory cells.

Significant interest is presently being directed toward programmable materials that contain mobile charge carriers larger than electrons and holes. The charge carriers may be ions in some example applications. The programmable materials may be converted from one memory state to another by moving the mobile charge carriers therein to alter a distribution of charge density within the programmable materials. Some example memory devices that utilize ions as mobile charge carriers are resistive RAM (RRAM) cells; which can include classes of memory cells containing multivalent oxides, and which can include memristors in some specific applications. Other example memory devices that utilize ions as charge carriers are programmable metallization cells (PMCs); which may be alternatively referred to as a conductive bridging RAM (CBRAM), nanobridge memory, or electrolyte memory.

The RRAM cells may contain programmable material sandwiched between a pair of electrodes. The programming of the RRAM cells may comprise transitioning the programmable material between first a memory state in which charge density is relatively uniformly dispersed throughout the material and a second memory state in which the charge density is concentrated in a specific region of the material (for instance, a region closer to one electrode than the other). A PMC cell may similarly have programmable material sandwiched between a pair of current conductive electrodes. However, programming of the PMC comprises transitioning the PMC between a first state in which there is no conductive bridge between the electrodes and a second state in which mobile ions arrange to form super-ionic clusters or conducting filaments that electrically couple the electrodes to one another.

An ideal memory device will stably remain in a memory state after programming, and yet will be easy to program. It is difficult to accomplish both aspects of the ideal memory cell. Specifically, memory cells which are highly stable in their memory states also tend to be difficult to program (since it is difficult to induce the transition between the memory states during the programming operation); and conversely, memory cells which are easy to program tend to be unstable in their memory states.

It would be desirable to develop new memory cells which have the desired aspects of stability and relative ease of programming.

DETAILED DESCRIPTION OF THE ILLUSTRATED EMBODIMENTS

In some embodiments the invention includes novel memory cells incorporating charge carriers larger than electrons or holes as species utilized during the programming of the memory cells. Example charge carriers that may be used in such embodiments are ions. The charge carriers are moved within the memory cells during programming, and in some embodiments it is recognized that it is advantageous for an average charge across the moving charge carriers to have an absolute value greater than 2. Such high average charge can enhance programming of the memory cells without adversely affecting stability of the memory states of the memory cells.

The memory cells may be any memory cells that utilize charge carriers larger than electrons or holes, such as, for example, PMC devices and RRAM devices. Prior to discussing specific memory cells of example embodiments, the operation of a PMC device will be described with reference to FIGS. 1 and 2, and the operation of a RRAM device will be described with reference to FIGS. 3 and 4.

Figure 1:
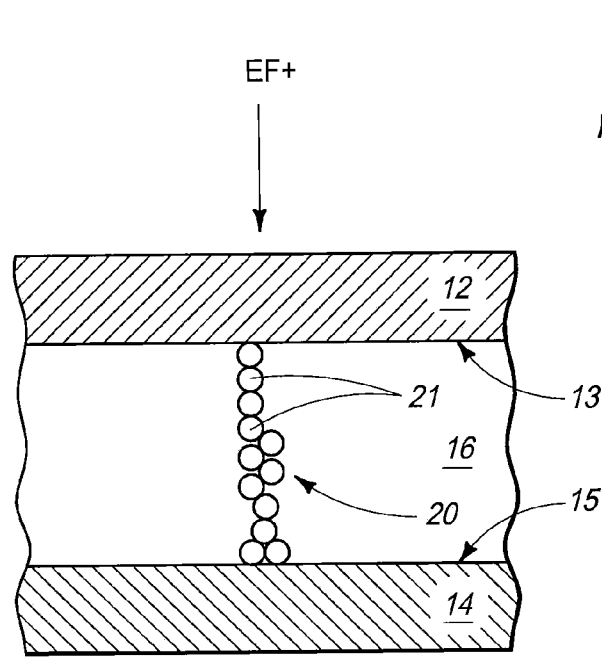
FIGS. 1 and 2 are diagrammatic views of a programmable metallization cell in a low resistance state and in a high resistance state, respectively.
Figure 2:
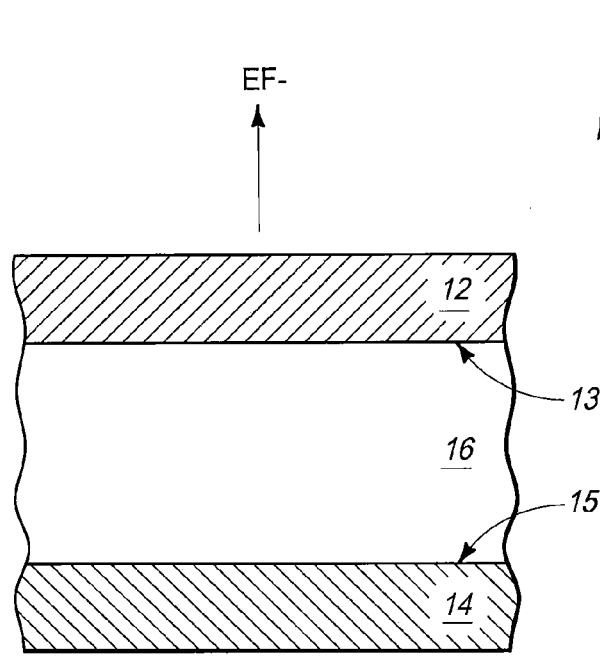

FIGS. 1 and 2 diagrammatically illustrate a PMC device 10 in both a low resistance state (FIG. 1) and a high resistance state (FIG. 2).

FIG. 1 shows the PMC device 10 to comprise ion conductive material 16 between a pair of electrodes 12 and 14. The electrode 12 comprises a surface 13 which is electrochemically active, while the electrode 14 comprises a surface 15 which is electrochemically inactive.

Electrodes 12 and 14 may comprise any suitable electrically conductive materials, and may be homogenous or non-homogenous. By way of examples only, suitable electrochemically active materials include copper, silver, and alloys including at least one of copper and silver. Example suitable electrochemically inactive materials include titanium nitride, gold, tungsten, platinum, and alloys including at least one of gold, tungsten or platinum.

Ion conductive material 16 may be a solid, gel, or any other suitable phase, and may comprise any suitable composition. In some embodiments the material 16 may comprise chalcogenide-type material (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and CuTe) and/or oxides such as zirconium oxide, hafnium oxide, tungsten oxide, silicon oxide (specifically, silicon dioxide), gadolinium oxide, etc. The ion conductive material 16 may have silver ions or other suitable ions diffused therein for ionic conduction, analogously to structures disclosed in U.S. Pat. No. 7,405,967 and U.S. Patent Publication Number 2010/0193758.

Application of electric field (EF+) across the PMC device 10 forms a current conducting filament 20 of ionic particles 21. The individual ionic particles may be super-ionic clusters, and/or may be individual ions. The filament 20 extends between the electrodes 12 and 14, and thus provides a low-resistance current conduction path through the ion conductive material 16 within the PMC device 10. The device 10 having filament 20 therein may be considered to be in a low-resistance state. The conductive path formed by the particles 21 may comprise the particles directly contacting one another (as shown), or may comprise small gaps between some of the particles.

FIG. 2 shows device 10 as an electric field (EF−) is applied to the device. The electric field (EF−) is of opposite polarity relative to the field (EF+) of FIG. 1, and causes ions to move back to the active surface 13 of electrode 12—thereby dissipating the filament 20 (FIG. 1). Accordingly, the low-resistance path provided by such filament is removed, and the device 10 is transitioned into a high-resistance state.

Figure 3:
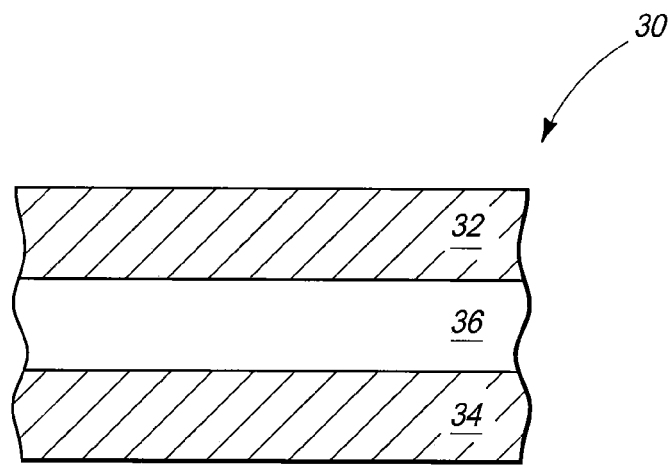
FIGS. 3 and 4 are diagrammatic views of a RRAM cell in a first memory state and in a second memory state, respectively.
Figure 4:
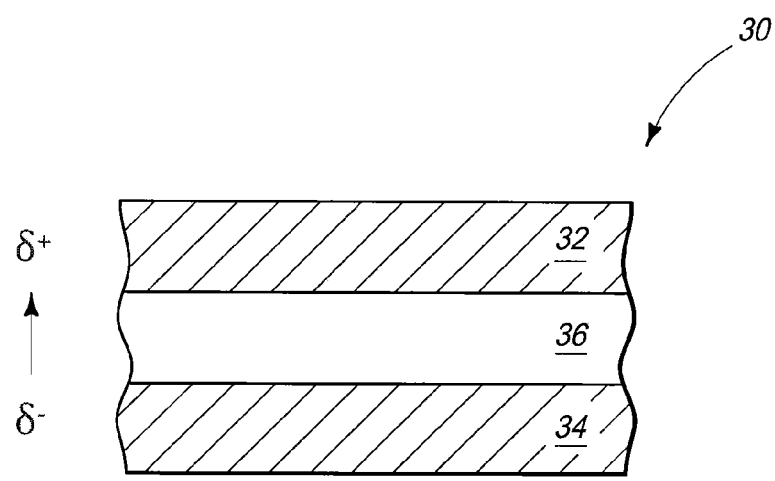

FIGS. 3 and 4 diagrammatically illustrate an RRAM device 30 in a first memory state (FIG. 3) and a second memory state (FIG. 4). The first and second memory states may differ from one another in resistance or any other suitable electrical property.

FIG. 3 shows the RRAM device 30 to have programmable material 36 between a pair of electrodes 32 and 34. The electrodes 32 and 34 may comprise any suitable composition or combinations of compositions; and in some embodiments may comprise, consist essentially of, or consist of one or more of various metals (for instance, copper, platinum, titanium, tungsten, etc.), metal-containing compositions (for instance, metal nitride, metal silicide, etc.) and conductively-doped semiconductor material (for instance, conductively-doped silicon, conductively-doped germanium, etc.).

The programmable material 36 may comprise any suitable composition or combination of compositions containing appropriate mobile charge carriers (with example mobile charge carriers being ions). For instance, material 36 may comprise, consist essentially of, or consist of multivalent oxide containing one or more of barium, ruthenium, strontium, titanium, calcium, manganese, praseodymium, lanthanum and samarium. An example multivalent metal oxide may comprise, consist essentially of, or consist of calcium manganese oxide doped with one or more of Pr, La, Sr and Sm. Although the programmable material 36 is shown as a single homogeneous layer, in some embodiments the programmable material may comprise two or more discrete layers. For instance, the programmable material may comprise a pair of oxide layers, such as the dual-layer oxides described by Meyer et. al. (R. Meyer et. al. "Oxide Dual-Layer Memory Element for Scalable Non-Volatile Cross-Point Memory Technology" (2008), available from IEEE Xplore).

FIG. 3 shows a memory state in which mobile charge carriers are relatively uniformly dispersed throughout programmable material 36, and thus the charge is relatively uniformly dispersed throughout the programmable material. In contrast, FIG. 4 shows a memory state in which mobile charge carriers are concentrated near one of the electrodes 32 and 34 to form a more positively charged region adjacent the upper electrode 32. The concentration of charge is illustrated with a charge gradient going from $\delta^-$ to $\delta^+$ along a direction from the bottom electrode 34 toward the top electrode 32. The mobile charge carriers may be either positive or negative, and thus may migrate toward the top electrode to form the shown gradient in some embodiments, or may migrate toward the bottom electrode to create the shown gradient in other embodiments. The illustrated gradient is one example configuration that may result from movement of charge carriers within programmable material 36, and numerous other configurations may be achieved in other embodiments. For instance, in some embodiments the illustrated gradient may be reversed so that the gradient goes from $\delta^+$ to $\delta^-$ along the direction from the bottom electrode 34 toward the top electrode 32.

The memory states of FIGS. 3 and 4 may be interchanged with one another through application of electric fields to the device 30, analogous to the electric field applications discussed above with reference to FIGS. 1 and 2.

As discussed previously, some embodiments utilize relatively highly charged mobile charge carriers (for instance, a population of charge carriers having an average charge across the population with an absolute value of greater than 2). A possible theoretical basis for the benefit of such highly charged mobile charge carriers is as follows.

Ionic transport may be described as an ionic drift ($v_D$). The ionic drift may be expressed in terms of an attempt frequency (v), a jump distance (d), a potential barrier ($E_a$), a Boltzmann constant ($k_B$), the absolute temperature (T), the charge number of a mobile charge carrier (z), the elementary charge (q), and the electric field (E) as shown in Equation 1.

$$v_D = vd\,\exp\!\left[-\frac{E_a}{k_B T}\right]\sinh\!\left[\frac{|z|qdE}{2k_B T}\right]. \qquad \text{Equation 1}$$

Equation 1 may be considered to comprise one term corresponding to a thermal component, and another term corresponding to a field component. Specifically, the thermal component may be expressed as shown in Equation 2, and the field component may be expressed as shown in Equation 3.

$$\text{Thermal component} = vd\ \exp\left[-\frac{E_a}{k_B T}\right] \quad \text{Equation 2}$$

$$\text{Field component} = \sinh\left[\frac{|z|qdE}{2k_B T}\right]. \quad \text{Equation 3}$$

The thermal component is related to diffusion of ions, and relates to the stability of a memory state within a memory device. The field component represents the effect of a local electric field on drift, and relates to the ease of programmability of a memory device. Notably, the thermal component is not affected by the charge of the mobile charge carriers (the term "z" of Equation 1), whereas the field component is strongly affected by such charge (since the charge is in a numerator of a sin h function). Accordingly, increasing the charge of mobile charge carriers utilized in a memory device can increase the ease of programming of the device without detrimentally affecting the stability of the various memory states of the device.

It is noted that multiple charge states of a charge carrier species will frequently be in equilibrium with one another. For instance, a single charge carrier may exist in the charge states of 0 (i.e., neutral), +1, +2, +3, +4, etc. Thus, it is an overall charge state of a population of charge carriers that is of interest in some embodiments. It is also noted that it is the absolute value of the charge ("z" in Equation 1) that matters, and thus a negative charge can provide equal benefit as a positive charge of the same magnitude.

The theoretical basis is provided to assist the reader in understanding the various embodiments presented herein and is not to limit the claims that follow except to the extent, if any, that it is expressly recited in such claims.

Example embodiment memory cells utilizing mobile charge carriers with an average value of |z| (i.e., the absolute value of charge) greater than 2 are described with reference to FIGS. 5 and 6.

Figure 5:
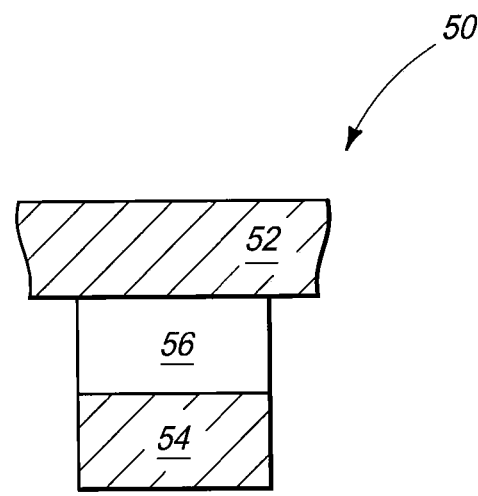
FIG. 5 is a diagrammatic cross-sectional view of an example embodiment memory cell.
Figure 6:
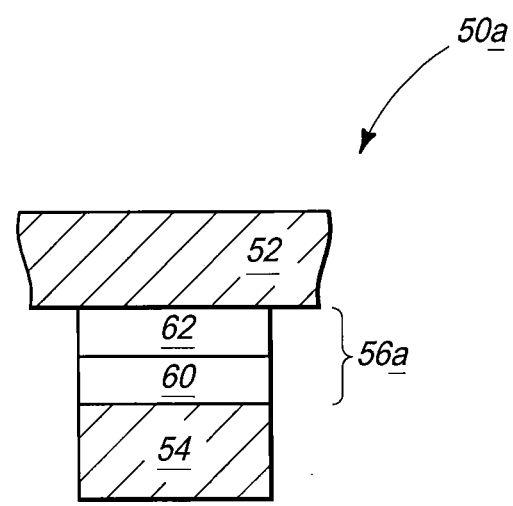
FIG. 6 is a diagrammatic cross-sectional view of another example embodiment memory cell.

Referring to FIG. 5, such shows an example embodiment memory cell 50 having a programmable material 56 between a pair of electrodes 52 and 54.

The memory cell may be supported by a semiconductor base (not shown), and thus may be incorporated into integrated circuitry. If the memory cell is over a semiconductor base, such semiconductor base may comprise any suitable composition or combination of compositions, and in some embodiments may comprise, consist essentially of, or consist of monocrystalline silicon lightly background doped with appropriate p-type dopant. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

The electrodes 52 and 54 may comprise any of the materials discussed relative to electrodes 12, 14, 32 and 34 of FIGS. 1-4. In some embodiments the bottom electrode 54 may be part of a conductive line that extends along a first direction (for instance into and out of the page relative to the cross-section of FIG. 5) and the top electrode 52 may be part of a conductive line that extends along a direction orthogonal to the direction of the bottom electrode line (for instance, the top electrode line may extend along a plane of the cross-section of FIG. 5). Accordingly, the programmable material 56 may be formed at a cross-point where the top and bottom electrode conductive lines overlap. The bottom electrode conductive line may be a representative example of a first series of conductive lines, the top electrode conductive line may be a representative example of a second series of conductive lines, and the memory cell 50 may be representative example of a plurality of memory cells formed at cross-points where lines from the second series overlap lines of the first series. The memory cells may be arranged as a memory array, and each memory cell of such array may be uniquely addressed through the combination of a line from the second series and a line from the first series.

The programmable material 56 may be suitable for utilization in any of numerous memory cells that utilize mobile charge carriers larger than electrons and holes; and may, for example, be suitable for utilization in PMC devices of the type described with reference to FIGS. 1 and 2, or for utilization in RRAM devices of the type described with reference to FIGS. 3 and 4.

The memory cell 50 is programmed by moving a plurality mobile charge carriers within programmable material 56. An average charge across the entire population of mobile charge carriers (or in some embodiments across the subset of the population corresponding to moving mobile charge carriers) may have an absolute value of greater than 2, and in some embodiments may be at least about 3. The high average charge can enable rapid programming of the memory cell without adversely affecting memory state stability of the memory cell, as discussed above with reference to Equations 1-3.

The programmable material 56 may comprise any suitable charge carrying species, including, for example, one or more of aluminum, chromium, iron, manganese, titanium, tungsten and vanadium. Each of aluminum, chromium, iron, manganese, titanium, tungsten and vanadium has a stable charged species in which an absolute value of the charge exceeds 3.

In some embodiments the programmable material 56 may comprise, consist essentially of, or consist of the mobile charge carriers dispersed throughout an aluminum nitride matrix. In such embodiments the mobile charge carriers may correspond to one or more species described by Stampfl and Van de Walle (C. Stampfl and C. G. Van de Walle "Theoretical investigation of native defects, impurities and complexes in aluminum nitride" Physical Review B, volume 65, pages 155212-1 through 155212-10 (2002)). Accordingly, the mobile charge carriers may comprise one or more of interstitial nitrogen, interstitial aluminum ($Al^{3+}$), nitrogen vacancies ($V_N^{3+}$), and aluminum vacancies. Alternatively, or additionally, the mobile charge carriers may include one or more interstitial atoms other than nitrogen and aluminum; such as, for example, any of various non-metals (such as, for example, oxygen), semimetals (such as, for example, silicon) and metals (such as, for example, magnesium).

If memory cell 50 is a PMC-type device, the memory cell may be programmed by moving mobile charges to either form a filament analogous to the filament 20 described above with reference to FIG. 1, or to dissolve such filament. If memory cell 50 is an RRAM-type device, the memory cell may be programmed by moving mobile charges to reversibly alter charge distribution within the programmable material 56 analogous to the programming described above with reference to FIGS. 3 and 4.

The memory cell 50 may be formed with any suitable processing. In some embodiments the bottom electrode 54 may be formed over a semiconductor base. The bottom electrode may be formed as one of a series of spaced apart electrically conductive lines. The programmable material 56 may then be formed over the bottom electrode, and then the top electrode may be formed over the programmable material. The top electrode may be formed as one of a second series of electrically conductive lines, with the lines of the second series extending substantially orthogonally relative to the lines of the first series. The programmable material may be formed only at memory cell locations (i.e., only at crosspoints where top electrodes overlap bottom electrodes) in some embodiments, and may extend beyond the memory cell locations in other embodiments. In some embodiments it can be desired that the programmable material of the individual memory cells of a memory array be contained only within the individual memory cells, and that dielectric material be formed between adjacent memory cells of the memory array, to alleviate or prevent cross-talk between the adjacent memory cells.

FIG. 5 shows a memory cell comprising programmable material 56 as a single homogeneous layer sandwiched between electrodes 52 and 54. In other embodiments the programmable material may comprise two or more discrete layers which share a common mobile carrier species. FIG. 6 shows a memory cell 50a comprising the top and bottom electrodes 52 and 54 described above with reference to FIG. 5, and comprising a programmable material 56a containing two discrete layers 60 and 62. In other embodiments the programmable material 56a may comprise more than two discrete layers.

In the shown embodiment the top electrode 52 is directly against one of the discrete layers, and the bottom electrode 54 is directly against the other of the discrete layers.

The programmable material 56a may comprise any suitable layers. In some embodiments one of the layers 60 and 62 may be referred to as a first layer and the other may be referred to as a second layer. The first layer may comprise an aluminum nitride matrix containing mobile charge carriers, and the second layer may comprise a composition having a mobile charge carrier in common with the first layer. For instance, if interstitial aluminum is a mobile charge carrier within the first layer, the second layer may comprise, consist of, or consist of aluminum oxide. The aluminum oxide may be formed to have excess aluminum (i.e., an aluminum concentration exceeding the stoichiometric concentration of aluminum in $Al_2O_3$) so that the aluminum oxide second layer has aluminum ions as mobile charge carriers therein. In such examples, the common mobile charge carrier between the first and second layers may be an ion species corresponding to $Al^{3+}$. As another example, the mobile charge carriers within the aluminum nitride matrix of the first layer may include an interstitial metal other than aluminum, and the second layer may comprise a composition containing such metal. As another example, the mobile charge carriers within the aluminum nitride matrix of the first layer may include interstitial semimetals and/or non-metals, and the second layer may comprise a composition containing such semimetals and/or non-metals.

The memory cells discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A memory cell, comprising:
   a first electrode corresponding to a first conductive line;
   programmable material over the first electrode, the programmable material being only two discrete layers; one of said two discrete layers being aluminum nitride with mobile ion species therein, and the other of said two discrete layers being aluminum oxide that is formed to have an excess aluminum concentration that exceeds the stoichiometric concentration of aluminum in $Al_2O_3$, the aluminum oxide having mobile ion species therein which are chemically the same as mobile ion species within the first layer;
   a second electrode corresponding to a second conductive line that is orthogonal relative to the first conductive line, the second electrode being directly over the programmable material; the aluminum nitride being directly against one of the first and second electrodes and the aluminum oxide being directly against the other of the first and second electrodes, the programmable material being present only at an intersection where the first and second conductive lines cross; and
   wherein one of the first and second electrodes comprises one or both of titanium and platinum.

2. The memory cell of claim 1 wherein the mobile ions include $Al^{3+}$.

3. The memory cell of claim 1 wherein the first electrode consists of one or both of titanium and platinum.

4. The memory cell of claim 1 wherein the second electrode consists of one or both of titanium and platinum.

5. A memory cell, comprising:
   a first electrode formed as a first conductive line;
   programmable material over the first electrode, the programmable material comprising two discrete layers directly against one another; one of said two discrete layers being aluminum nitride with mobile ion species therein, and the other of said two discrete layers being aluminum oxide that is formed to have an excess aluminum concentration that exceeds the stoichiometric concentration of aluminum in $Al_2O_3$, the aluminum oxide having mobile ion species therein which are chemically the same as mobile ion species within the first layer;

a second electrode formed as a second conductive line that is orthogonal to the first conductive line, the second electrode being directly over the programmable material; the aluminum nitride or the aluminum oxide being directly against the second electrode, the programmable material being present only at the intersection where the first and second conductive lines cross; and wherein one of the first and second electrodes comprises one or both of titanium and platinum.

6. A memory cell, comprising:

a first electrode line over a monocrystalline silicon-containing substrate, the first electrode line comprising a first electrode;

programmable material directly over and directly against the first electrode, the programmable material being only two discrete layers; one of said two discrete layers being aluminum nitride with mobile ion species therein, and the other of said two discrete layers being aluminum oxide that is formed to have an excess aluminum concentration that exceeds the stoichiometric concentration of aluminum $Al_2O_3$, the aluminum oxide having mobile ion species therein which are chemically the same as mobile ion species within the first layer; and a second electrode line orthogonal to the first electrode line, the second electrode line comprising a second electrode directly over and directly against the programmable material, the programmable material being present only at an intersection where the first and second electrode lines cross; the aluminum nitride being directly against the first electrode and the aluminum oxide being directly against the second electrode; and one of the first and second electrodes consisting of copper, and the other of the first and second electrodes consisting of one or both of titanium and platinum.

\* \* \* \* \*